United States Patent
Drapkin et al.

(10) Patent No.: US 6,922,079 B1
(45) Date of Patent: Jul. 26, 2005

(54) OUTPUT DRIVER APPARATUS AND METHOD THEREOF

(75) Inventors: Oleg Drapkin, Richmond Hill (CA); Grigory Temkine, Toronto (CA)

(73) Assignee: ATI Technologies, Inc., Thornhill (CA)

( * ) Notice: Subject to any disclaimer, the term of this patent is extended or adjusted under 35 U.S.C. 154(b) by 860 days.

(21) Appl. No.: 09/643,090

(22) Filed: Aug. 21, 2000

(51) Int. Cl.[7] ............................................. H03K 19/094
(52) U.S. Cl. ............................. 326/83; 326/30; 326/26; 326/87
(58) Field of Search ........................ 326/82, 83, 86–90, 326/26, 27, 3, 30

(56) References Cited

U.S. PATENT DOCUMENTS

| | | | | |
|---|---|---|---|---|
| 6,420,913 B1 | * | 7/2002 | Ang et al. | 327/108 |
| 6,541,996 B1 | * | 4/2003 | Rosefield et al. | 326/30 |
| 6,577,179 B2 | * | 6/2003 | Falconer | 327/530 |
| 6,624,659 B1 | * | 9/2003 | Abraham et al. | 326/82 |

* cited by examiner

*Primary Examiner*—Don Le
(74) *Attorney, Agent, or Firm*—Toler, Larson & Abel, LLP (57) ABSTRACT

A drive controller monitors a dynamic condition to determine when a transmission line impedance is to vary. In one embodiment, a specific bit pattern associated with a set of data lines can be monitored by the drive controller. Based upon the dynamic condition, the drive controller will determine whether or not the drive strengths of the output drivers associated with the data lines are to be adjusted. The variance in line is compensated for by independently increasing or decreasing drive strengths at the individual output nodes of the drivers.

33 Claims, 5 Drawing Sheets

OUTPUT DRIVER APPARATUS AND METHOD THEREOF

FIELD OF THE INVENTION

Present invention relates generally to output drivers, and more specifically to an apparatus and method of dynamically selecting characteristics of the output driver.

BACKGROUND OF THE INVENTION

Operating frequencies of semiconductor devices have increased dramatically as new processing technologies have been developed. At high frequencies, the connections between output drivers and input buffers cannot be treated as an electrical short. Instead, the connections between drivers and buffers need to be characterized as a transmission line having a specific impedance. It is well known for output buffers to have an impedance that matches the impedance of the line which it is driving. Known solutions for matching output buffer impedance to transmission line impedance include allowing for output buffers with programmable impedance that can be fixed. For example, an output buffer may have a programmable impedance in the range of 40 to 70 ohms with a resolution of 5 ohms to match a typical transmission line impedance.

While buffers with programmable impedance are useful for matching specific components to a specific system, such impedance matching techniques do not accommodate variances in transmission line impedance that can occur during high frequency operation. For example, variations in impedance can occur during operation depending upon the specific data pattern been transmitted over one or more data lines because of parasitic capacitance and inductance of the package, as well as because of parasitic capacitance and inductance of the signal traces. An apparatus capable of adjusting the drive strength of output buffers and/or impedance of output buffers to accommodate these dynamic variances in impedance would be useful.

One skilled in the art will appreciate that elements in the Figures are illustrated for simplicity and clarity and have not necessarily been drawn to scale. For example, the dimensions of some of the elements in the Figures are exaggerated relative to other elements to help to improve understanding of embodiment(s) of the present invention.

DETAILED DESCRIPTION OF THE DRAWINGS

In accordance with a specific embodiment of the present invention, a drive control monitors a dynamic condition to determine when a transmission line impedance is to vary. For example, a specific bit pattern associated with DATA1–DATAn can be monitored by the drive control. Based upon the dynamic condition, the drive control will determine whether the drive strength of output drivers at one or more nodes is to be adjusted. Independently increasing or decreasing drive strengths at the individual output nodes of the drivers compensates for the variance in line impedance. The present invention is better understood with reference to the specific embodiments illustrated FIGS. 1–6.

Figure 1:
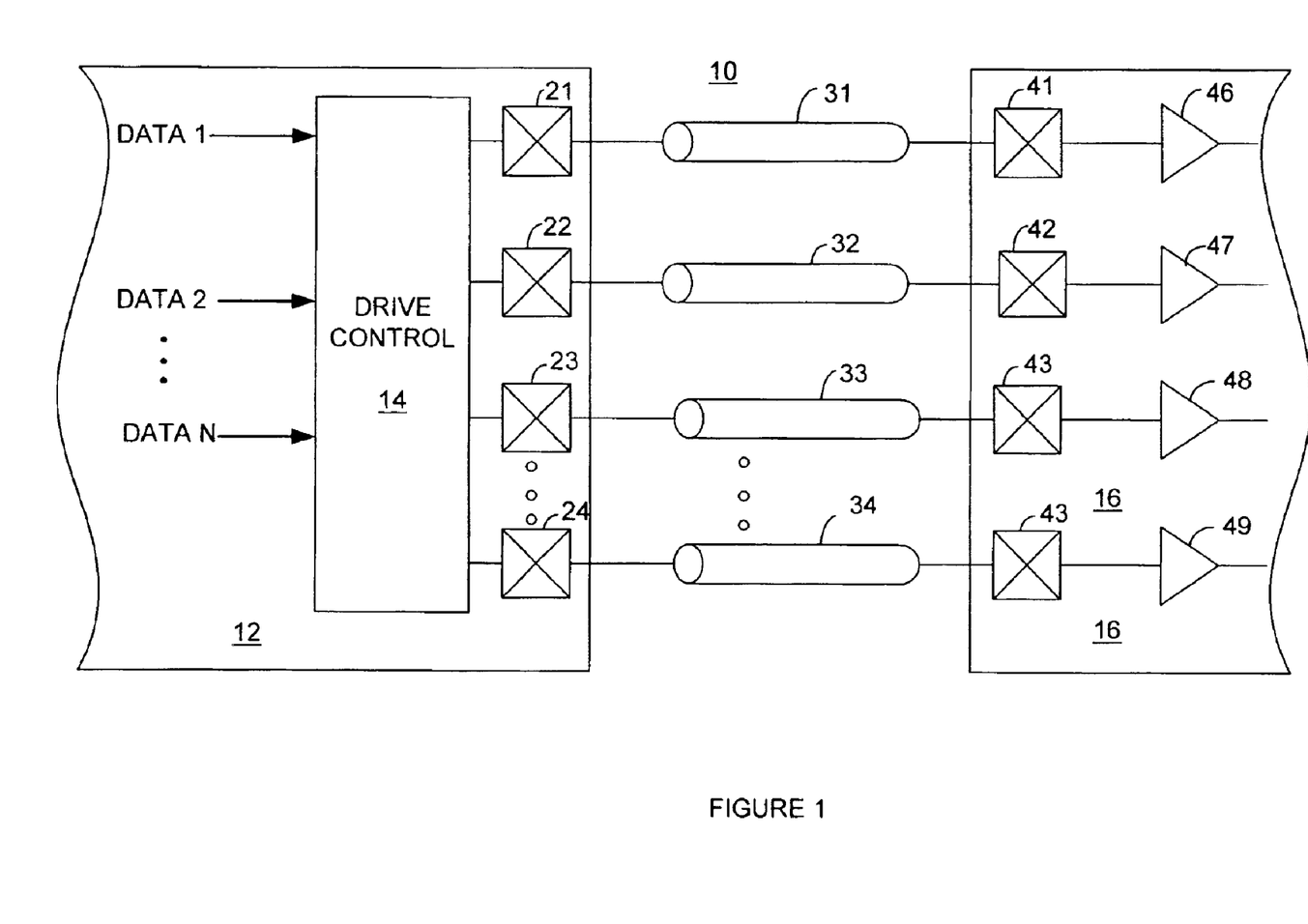
FIG. 1 illustrates, in block diagram form, a system in accordance with present invention.

FIG. 1 illustrates, in block diagram form, a system 10 in accordance with present invention. The system 10 of FIG. 1 includes a first device 12 connected to a second device 16 through interconnects 31–34. Generally, devices 12 and 16 can represent two separate semiconductor devices connected by circuit board interconnect 31–34 (traces), or different portions of a common semiconductor device where the interconnects 31–34 would be conductive traces on the semiconductor device. In one embodiment, the devices 12 and 16 are a data processor and memory respectively. In another embodiment, the device 12 and 16 are each data processors. The interconnects 31–34 can represent individual data lines associated with a bus. The interconnects 31–34 are illustrated as transmission lines because they can be driven by signals having transition rates that result in a transmission line impedance being observed from the driving device 12.

The device 12 includes a drive control 14 having inputs to receive data signals DATA1–DATAn, and outputs for driving nodes 21–24. Note in other embodiments, the drive control 14 can have bi-directional drivers connected to the nodes 21–24, however, for purposes of discussion, drive controller 14 is treated as having output drivers only.

The static line impedance may be the same or different for each of the transmission lines 31–34. The static line impedance means the line impedance under a predefined condition. For example, for a specific data being transmitted, at a specific drive strength, a static line impedance will be observed.

In one embodiment, the transmission lines 31–34 may be functionally related. For example, they may be individual bit lines of a data bus. In another embodiment, transmission lines 31–34 are not functionally related. For purposes of discussion herein, any traces having adjacent numbers, for example, traces 31 and 32, are considered to be immediately adjacent to one another. For example, the trace 31 is immediately adjacent to trace 32 when they are routed side-by-side with no other traces between them. Traces located immediately adjacent to each other are more susceptible to cross-talk than traces spaced further apart. It will be appreciated that two traces which are side-by-side for a significant length can also be considered immediately adjacent. In addition to be adjacent in the horizontal plane, it is possible for traces to be adjacent in other planes as well. For example, two traces can be adjacent in the vertical or diagonal plane.

In operation, the dynamic control portion 14 monitors the data values DATA1–DATAn to predict the impedance of each transmission line 31–34 during a next transition. Based upon the predicted value, the drive strength of the buffers that drive lines 31–34 will be adjusted. Generally, if the drive control 14 detects that a specific transmission line impedance is going to increase due to a specific sequence of output bit values (bit pattern), the drive strength of the output buffer driving that specific transmission line will be increased. The higher drive strength helps overcome the effects of increased impedance. Similarly, if the drive control 14 detects that a specific transmission line impedance is going to decrease due to a specific output bit pattern, the drive strength of the output buffer driving that specific transmission line will be decreased.

In a specific embodiment, the dynamic control portion 14 monitors the data values DATA1–DATAn in real time. For a synchronous system real-time indicates that each possible transition time is monitored. For example, if data on a specific data line can change once every clock cycle, the drive control 14 will monitor the data value on that data line at least once every clock cycle. Likewise, the drive control 14 can adjust the output drivers in real-time. The actual adjustment made to the output drivers can be made prior to when the predicted change in impedance is to occur, just after the time when the change in impedance is expected to occur, or prior to and continuing into the time when the change in impedance is expected.

Figure 2:
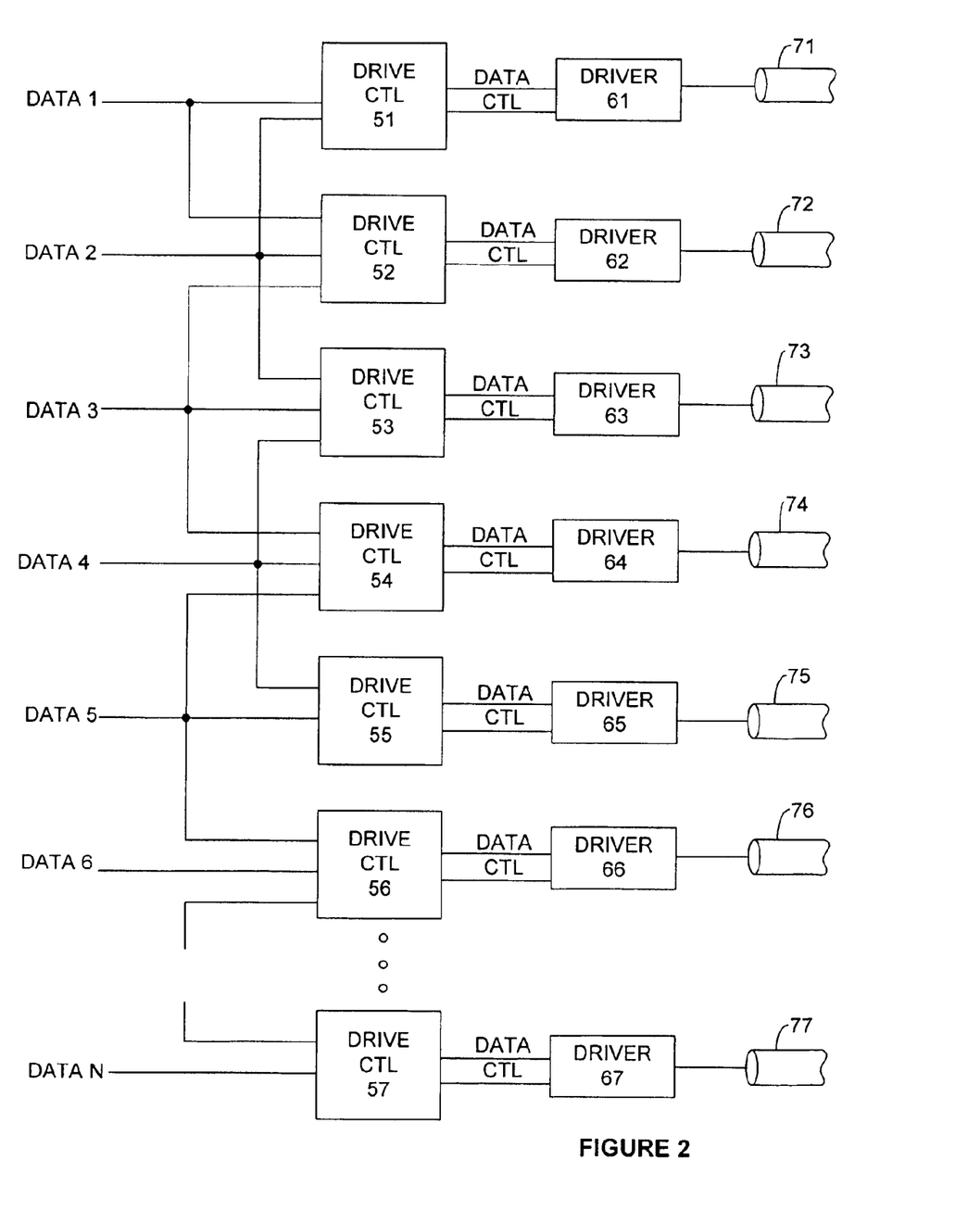
FIG. 2 illustrates, in block diagram form, a portion of the drive controller of FIG. 1 in greater detail.

FIG. 2 illustrates a portion of the drive control 14 in greater detail and portions of the transmission lines 71–77. Specifically, FIG. 2 illustrates output drivers 61–67, and drive controls 51–57. Each of the transmission lines 71–77 is driven by a drive control/driver combination. For example, transmission line 71 is driven by driver 61, which receives data and control signals from the drive control 51. Likewise, driver 61, which receive data and control signals from the drive control 52, drives transmission line 72.

Each of the drive controls 51–57 is connected to receive the data to be driven by its respective driver 61–68, and the data to be driven by the immediately adjacent drivers as well. For example, the signal labeled DATA2 is provided to the adjacent drive controls 51 and 53, as well as to drive control 52. Note that in the specific embodiment of FIG. 2, the first and last drive controls, drive control 51 and drive control 57, receive only one adjacent data signal.

Figure 3:
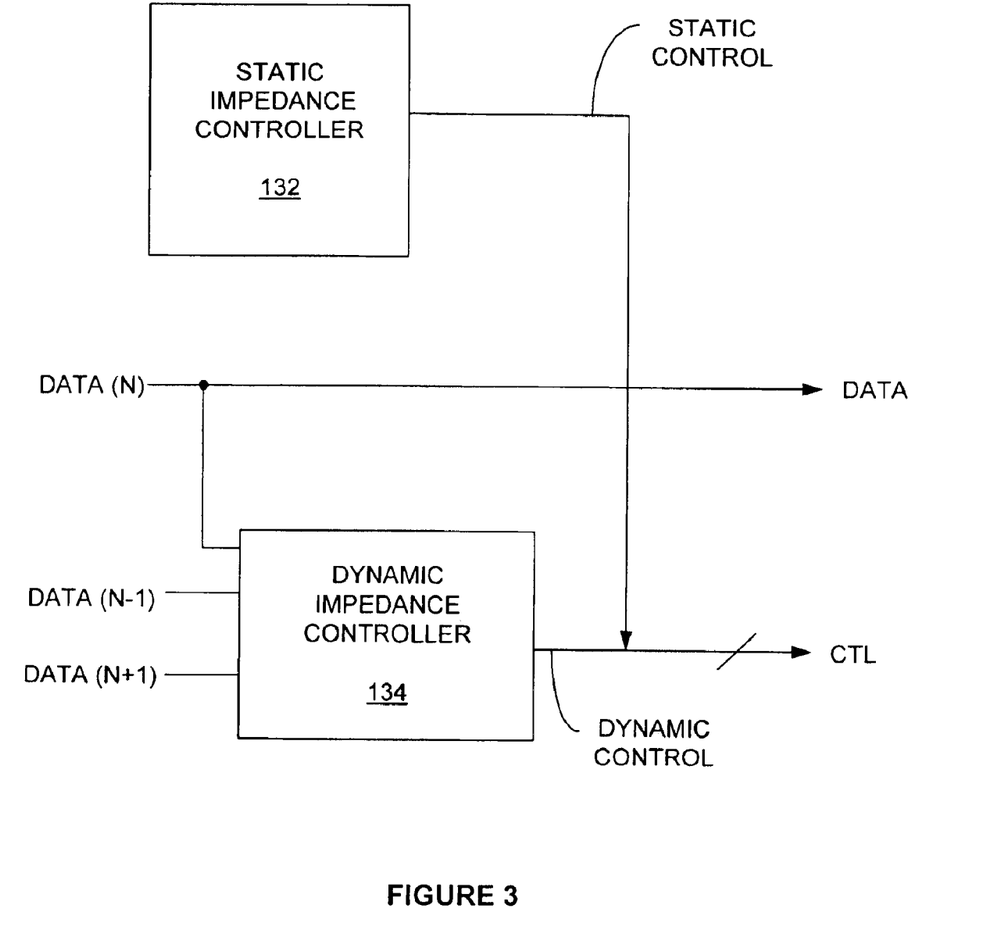
FIG. 3 illustrates, in block diagram form, a portion of one of the drive controls of FIG. 2 in greater detail.

FIG. 3 illustrates a specific embodiment of one of the drive control blocks 51–57. For purposes of example, FIG. 3 is identified as drive control block 52. Specifically, the drive control block 52 includes a static impedance controller 132 and a dynamic impedance controller 134. The dynamic impedance controller 134 receives data to be driven at its own output drive (DATA(N)), as well as the data to be driven by the immediately adjacent output drivers (DATA(N+1) and DATA(N−1)). The dynamic impedance controller 134 monitors the received data values and generates a dynamic control signal based on these values.

The static impedance controller 132 sets the static impedance of the output driver. Generally, a static impedance controller can be used to set impedance of the driver in the range of 10–110 Ohms. The static impedance controller 132 provides a signal labeled STATIC CONTROL, which is sent to the driver.

Figure 4:
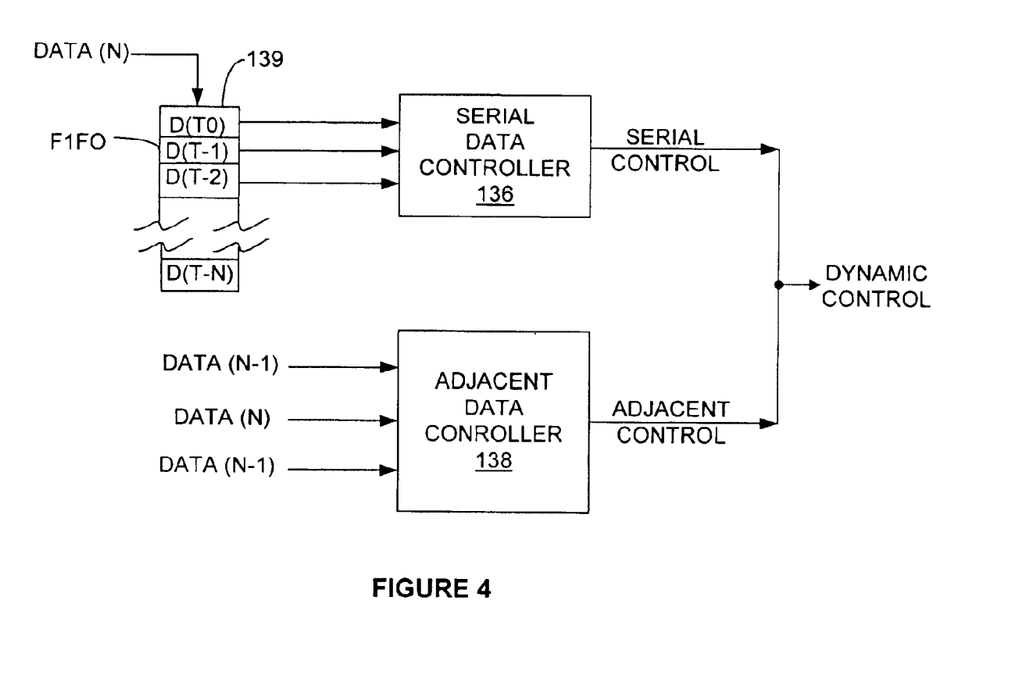
FIG. 4 illustrates, in block diagram form, a portion of the dynamic impedance controller of FIG. 3 in greater detail.

FIG. 4 illustrates the dynamic impedance controller 134 of FIG. 3 in greater detail. Specifically, FIG. 4 includes a serial data controller 136 and an adjacent data controller 138.

The serial data controller 136 monitors a serial bit stream of data associated with the output buffer of the controller. The serial bit stream data is stored in a storage location 139. In a specific embodiment, the storage location 139 can be a first-in-first-out memory (FIFO) that stores the data that has been and/or will be driven by the associated driver. In a specific implementation, the FIFO will have a predetermined depth. For example, the FIFO can hold three bits or five bits of data. In other implementations, the depth of the FIFO can be programmable. By having a programmable FIFO depth, higher order effects of previously driven data can be determined. However, it should be understood that the heuristics used to control the drive strength of the output buffer would control the overall complexity of the system.

As illustrated in FIG. 4, the serial data controller 136 is connected to three storage locations of memory 139, and generates a control signal labeled SERIAL CONTROL. The SERIAL CONTROL signal is used at the output driver to adjust its drive strengths based upon the serial data stream associated with buffer.

The adjacent data controller 138 monitors adjacent bits of data associated with the controller 134. The monitored adjacent data can include just the immediately adjacent bits of data, or a plurality of immediately adjacent bits. Higher order cross-talk effects can be taken into account by monitoring a plurality of immediately adjacent bits. However, it should be understood that the complexity of the system would be based upon the heuristics used to control the drive strength. As illustrated in FIG. 4, the adjacent data controller 138 generates a signal labeled ADJACENT CONTROL, which is based upon the values of the adjacent data bits, and data to be driven.

The manner in which the data drivers are to be adjusted is better understood with reference to the sample bit pattern illustrated in the table below.

TABLE 1

(Sample Bit Pattern)

| | T0 | T1 | T2 | T3 | T4 |
|---|---|---|---|---|---|
| OUT1 | 0 | 0 | 1 | 0 | 0 |
| OUT2 | 1 | 1 | 0 | 1 | 0 |
| OUT3 | 0 | 0 | 1 | 0 | 1 |
| OUT4 | 1 | 1 | 1 | 0 | 1 |
| OUT5 | 0 | 0 | 0 | 1 | 0 |

The rows of the table represent five output drivers OUT1–OUT5. The columns of the table represent five time cycles T0–T4. The values in the table represent signal values driven by the drivers during the indicated time cycle. The cycles T0–T4 can be either future output values, past output values or a combination of past and future output values.

TABLE 2

(Sample Bit Pattern)

| | T0 | T1 | T2 | T3 | T4 |
|---|---|---|---|---|---|
| OUT1 | 0 | 0 | 1 | 0 | 0 |
| OUT2 | 1 | 1 | 0 | 1 | 0 |
| OUT3 | 0 | 0 | 1 | 0 | 1 |
| OUT4 | 1 | 1 | 1 | 0 | 1 |
| OUT5 | 0 | 0 | 0 | 0 | 1 |

The bold portion of Table 2 indicates a parallel portion of the bit pattern that will result in a predicted increase in impedance viewed at the driver OUT2. Specifically, during the transition from time T1 to time T2 the driver OUT2 is driving its data line from a high voltage value to a low voltage value, while the drivers OUT1 and OUT3 are driving their data lines in the opposite direction, i.e. from low voltage values to higher values. This bit pattern scenario can be predicted to result in cross-talk on the data line being driven by driver OUT 2, such that the effective impedance of this line is increased. In order to compensate, the adjacent data controller 138 of FIG. 4 detects this condition and provides an ADJACENT CONTROL signal that will increase the drive of driver OUT2 to assure the line it is driving will be discharged to an appropriate voltage level within the allotted time cycle. Likewise, when the transitions are opposite those highlighted in table 2, i.e. OUT2 is rising while OUT1 and OUIT3 are falling, the impedance of OUT2 can be predicted to increase.

TABLE 3

(Sample Bit Pattern)

|      | T0 | T1 | T2 | T3 | T4 |
|------|----|----|----|----|----|
| OUT1 | 0  | 0  | 1  | 0  | 0  |
| OUT2 | 1  | 1  | 0  | 1  | 0  |
| OUT3 | 0  | 0  | 1  | 0  | 1  |
| OUT4 | 1  | 1  | 1  | 0  | 1  |
| OUT5 | 0  | 0  | 0  | 0  | 1  |

Table 3 highlights data being driven at node 4. Specifically, the data is driven to a high voltage for three full cycles before being driven to a low voltage. When a common value is driven high over a trace for a long period of time, the effect is to filly charge the entire trace to a maximum voltage value. When frequently alternating data is being driven on a trace that is acting as a transmission, the trace does not fully charge. The impedance of a transmission line that is fully charged in this case is greater that the impedance of a transmission line that is partially charged. In accordance with a specific embodiment of the present invention, when a trace is fully charged can be predicted. For example, the driver OUT4 has been driven high for cycles T0–T2. In response, the output drive associated with driver OUT4 can be increased for time T3 to compensate for the increase in effective impedance of the data line. Note that an increase in effective impedance is also observed when a data line is fully driven to a low voltage. The number of cycles that are needed to affect the impedance of a data line (i.e. fully charge or discharge a trace) varies with the frequency of data change. Therefore, in a specific embodiment of the present invention, a user definable frequency indicator can be provided to assist in determining when the drive strengths need to be changed.

TABLE 4

(Sample Bit Pattern)

|      | T0 | T1 | T2 | T3 | T4 |
|------|----|----|----|----|----|
| OUT1 | 0  | 0  | 1  | 0  | 0  |
| OUT2 | 1  | 1  | 0  | 1  | 0  |
| OUT3 | 0  | 0  | 1  | 0  | 1  |
| OUT4 | 1  | 1  | 1  | 0  | 1  |
| OUT5 | 0  | 0  | 0  | 0  | 1  |

The bold portion of Table 4 indicates a parallel portion of the bit pattern that will result in a predicted decrease in line impedance viewed from the driver OUT4. Specifically, during the transition from time T3 to time T4 the drivers OUT3–OUT5 are each driving their data lines from a low voltage value to a high voltage value. This bit pattern scenario can be predicted to result in cross-talk on the data line being driven by driver OUT4, such that the effective impedance this line is decreased. In order to compensate, the adjacent data controller 138 of FIG. 4 is configured to detect this low impedance condition and to provide an ADJACENT CONTROL signal that will decrease the drive of driver OUT4 to assure the line it is driving will be discharged to an appropriate voltage level within the allotted time cycle. Likewise, when the transitions are opposite those highlighted in table 4, i.e. OUT3–OUT5 are transitioning from high to low, the impedance of OUT4 can be predicted to decrease.

Allowing for dynamic adjustments in drive strength is an advantage over the prior art because it allows for an overall reduction in power and system noise. Prior art buffers had to be designed to assume a worst-case bit pattern scenario, resulting in buffers that had drive strength greater than needed for most scenarios. Allowing for dynamic control drive strength allows the drive strength to be dynamically controlled based upon bit pattern information. Therefore, a reduction in noise and power consumption can be realized by allowing for dynamic monitoring and adjusting of all output buffer drive strengths.

Figure 5:
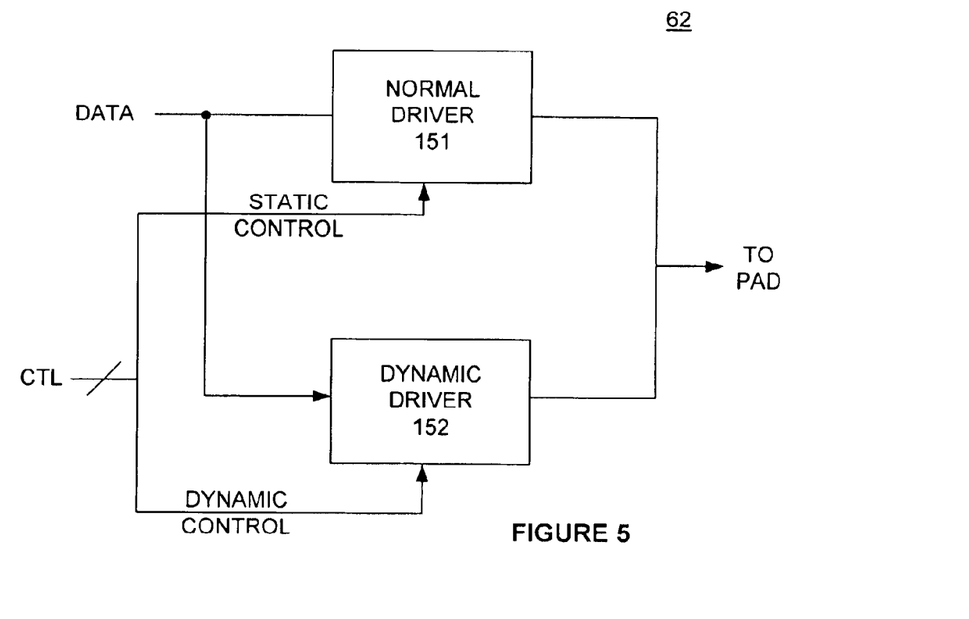
FIG. 5 illustrates, in block diagram form, a portion of one of the drivers of FIG. 2 in greater detail.

FIG. 5 illustrates in greater detail a specific embodiment of a driver, for example driver 62, controlled by the embodiments put forth herein. Specifically, the driver 62 includes a normal driver 151 connected to receive data signal and providing a signal to the output pad, or node. In addition, the driver 62 includes a dynamic driver 152 connected to receive the data signal and to provide a signal to the output pad, or node. In addition, each of the normal driver 151 and the data driver 152 receives at least a portion of control signal as discussed herein.

A static control portion of the control signal, which will set impedance of the driver to a predefined value, controls the normal driver 151. The user usually specifies the predefined value based upon the system specifications. In one embodiment, the normal driver 151 can be programmed to have impedance in a range of 10 to 110 ohms. The dynamic driver 152 receives a dynamic control signal portion from the control signal. The drive strength of the dynamic driver 152 various based upon the dynamic control signal as described herein.

Figure 6:
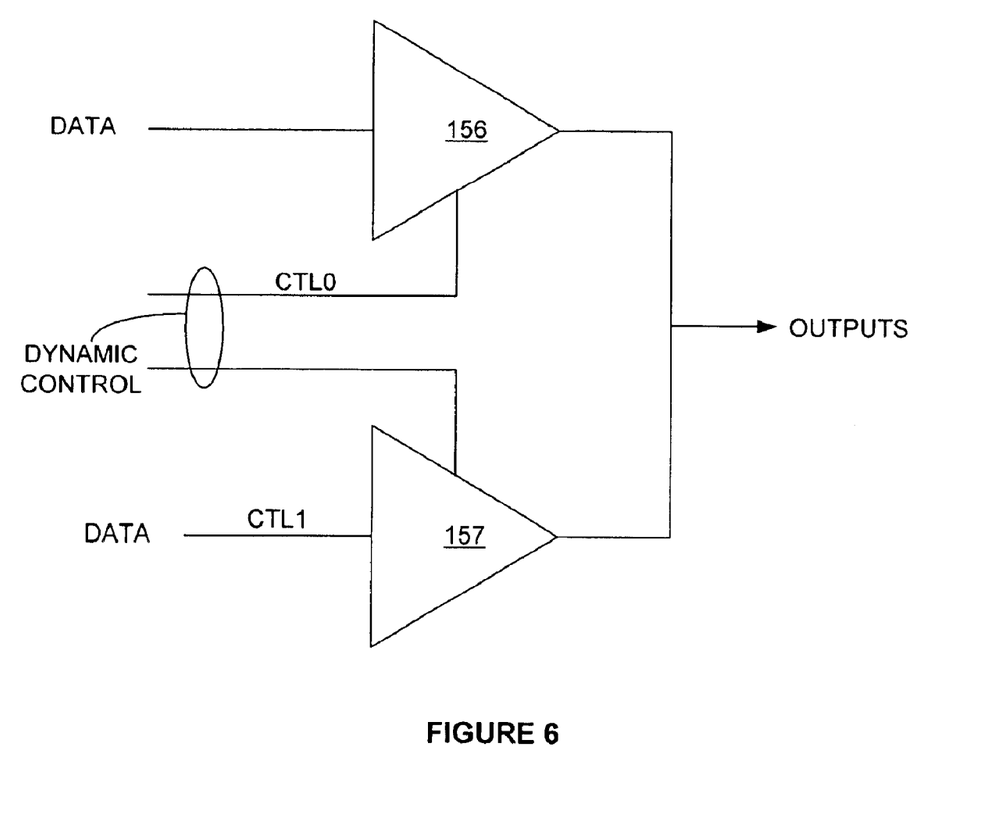
FIG. 6 illustrates, in block diagram form, a portion of the dynamic driver of FIG. 5 in greater detail.

FIG. 6 illustrates a specific implementation of the dynamic driver 157. In the specific implementation illustrated, the driver 156 and driver 157 each receive a DATA signal to be driven, and are coupled at their outputs to provide an output signal to the output node. The output buffer 156 is controlled by a signal labeled CTL0 and the output buffer 157 is controlled by signal labeled CTL1. In one embodiment, the driver 156 drives the output during normal operation, while the buffer 157 is turned off. When the dynamic control portion 134 of the driver control 14 determines that additional drive is needed, the signal CTL1 is asserted to turn on driver 157. Note additional drive includes both sinking and sourcing of current. When it is determined that less drive is needed, the signal CTL0 will be deasserted to turn off driver 156, thereby providing less drive. One skilled in the art will recognize that additional drivers can be used in order to provide a greater degree of resolution invariant drive strength.

In the foregoing specification, the invention has been described with reference to specific embodiments. However, one of ordinary skill in the art appreciates that various modifications and changes can be made without departing from the scope of the present invention as set forth in the claims below. For example, the control logic that monitors and changes the drive strengths can be enabled or disabled. In addition, specific monitoring criteria can be enabled, or specified by the user, and can be different for each node. For example, a driver driving the last bit of a data bus may not need dynamic drive adjustments. Also, where a device is driving data lines on a circuit board, it may be desirable for a user to specify which lines each driver's control module is to monitor (i.e. which lines are adjacent). Accordingly, the specification and figures are to be regarded in an illustrative rather than a restrictive sense and all such modifications are intended to be included within the scope of present invention. The claims means-plus-function clause(s), if any, cover the structures described herein that perform the recited function(s). The mean-plus-function clause(s) also cover structural equivalents and equivalent structures that perform the recited function(s). Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

We claim:

1. A method comprising: monitoring a dynamic condition that causes transmission line impedance to vary; dynamically determining based upon the dynamic condition if a drive strength of a first output coupled to a first node is to be adjusted; and dynamically adjusting the drive strength of the first output when determining indicates the drive strength of the first output is to be adjusted; wherein the dynamic condition includes a first plurality of values to be provided substantially simultaneously in time to a plurality of first nodes that are adjacent to the first output.

2. The method of claim 1, wherein: dynamically adjusting includes dynamically adjusting the drive strength of the first output based on the first plurality of values.

3. The method of claim 2, wherein dynamically adjusting includes:

reducing the drive strength of the first output when a signal at the first output is transitioning from a first voltage level to a second voltage level and a majority of the plurality of first nodes is also transitioning from the first voltage level to the second voltage level.

4. The method of claim 3, wherein the majority of first nodes include immediately adjacent nodes.

5. The method of claim 4, wherein the majority of first nodes include two immediately adjacent nodes.

6. The method of claim 2, wherein dynamically adjusting includes:

increasing the drive strength of the first output when a signal at the first output is transitioning from a first voltage level to a second voltage level and a majority of the plurality of first nodes is transitioning from the second voltage level to the first voltage level.

7. The method of claim 1, further comprising:

dynamically determining based upon the dynamic condition if an output drive strength of a second output coupled to a second node is to be adjusted, wherein determining if the output drive strength of the second output is to be adjusted is independent of determining if the output drive strength of the first output is to be adjusted; and dynamically adjusting the drive strength of the second output when determining indicates the drive strength of the second output is to be adjusted.

8. The method of claim 7, wherein:

monitoring the dynamic condition includes monitoring a first plurality of values to be provided substantially simultaneously in time to a plurality of first nodes that are adjacent to the first output; and dynamically adjusting includes dynamically adjusting the drive strength of the first output based on the first plurality of values.

9. The method of claim 8 wherein:

monitoring the dynamic condition includes monitoring a second plurality of values to be provided substantially simultaneously in time to a plurality of second nodes that are adjacent to the second output; and dynamically adjusting includes dynamically adjusting the drive strength of the second output based on the second plurality of values.

10. The method of claim 9, wherein the nodes of the plurality of first nodes are mutually exclusive of the nodes of the plurality of second nodes.

11. The method of claim 9, wherein the plurality of first nodes includes the second node.

12. The method of claim 11, wherein the plurality of second nodes includes the first node.

13. The method of claim 11, wherein the first node is immediately adjacent to the second node.

14. The method of claim 1, wherein dynamically determining includes determining for each transition of the first output if the output impedance of the first output is to be adjusted.

15. The method of claim 2, wherein dynamically adjusting includes:

increasing the drive strength of the first output when a signal at the first output is transitioning to a first voltage after having been at a second voltage state for two or more data cycles.

16. A method comprising:

monitoring a dynamic condition that causes transmission line impedance to vary, wherein the dynamic condition includes a first plurality of values to be provided sequentially in time to a first output:

dynamically determining based upon the dynamic condition if a drive strength of the first output is to be adjusted; and dynamically adjusting the impedance of the first output based on the first plurality of values.

17. A method comprising:

monitoring a bit pattern set to be output at a first output;

dynamically determining based on the bit pattern set if an output impedance of the first output is to be adjusted; and dynamically adjusting the impedance of the first output based on the bit pattern set.

18. The method of claim 17, wherein dynamically determining and dynamically adjusting occur for each output cycle of the first output.

19. The method of claim 17 further comprising: providing to the first output a representation of a portion of the bit pattern set after dynamically adjusting the impedance.

20. The method of claim 17, wherein the bit pattern set is associated with values that are output in parallel.

21. The method of claim 17, wherein the bit pattern set is associated with values that are output in serial.

22. An apparatus comprising:

means for monitoring a dynamic condition that causes transmission line impedance to vary, the dynamic condition including a first plurality of values to be provided substantially simultaneously in time to a plurality of first nodes that are adjacent to a first output;

means for dynamically determining based upon the dynamic condition if a drive strength of the first output coupled to a first node is to be adjusted; and means for dynamically adjusting the drive strength of the first output when determining indicates the drive strength of the first output is to be adjusted.

23. The apparatus of claim 22 wherein:
the means for dynamically adjusting includes means for dynamically adjusting the drive strength of the first output based on the first plurality of values.

24. The apparatus of claim 23, wherein the means for dynamically adjusting further is for reducing the drive strength of the first output when a signal at the first output is transitioning from a first voltage level to a second voltage level and a majority of the plurality of first nodes is also transitioning from the first voltage level to the second voltage level.

25. The apparatus of claim 23, wherein the means for dynamically adjusting further is for increasing the drive strength of the first output when a signal at the first output is transitioning from a first voltage level to a second voltage level and a majority of the plurality of first nodes is transitioning from the second voltage level to the first voltage level.

26. The apparatus of claim 22, further comprising:
means for dynamically determining based upon the dynamic condition if an output drive strength of a second output coupled to a second node is to be adjusted, wherein determining if the output drive strength of the second output is to be adjusted is independent of determining if the output drive strength of the first output is to be adjusted; and
means for dynamically adjusting the drive strength of the second output when determining indicates the second output is to be adjusted.

27. An apparatus comprising:
a first output coupled to a transmission line having a varying impedance based on a dynamic condition, the dynamic condition including a first plurality of values to be provided substantially simultaneously in time to a plurality of first nodes that are adjacent to a first output; and
a drive control coupled to the first output and operable to:
monitor the dynamic condition; and
dynamically adjust a drive strength of the first output based upon a determination that the drive strength of the first output is to be adjusted as a result of the dynamic condition.

28. The apparatus of claim 27, wherein:
the drive control is operable to adjust the drive strength of the first output based on the first plurality of values.

29. The apparatus of claim 28, wherein the drive control is operable to reduce the drive strength of the first output when a signal at the first output is transitioning from a first voltage level to a second voltage level and a majority of the plurality of first nodes is also transitioning from the first voltage level to the second voltage level.

30. The method of claim 28, wherein the drive control is operable to increase the drive strength of the first output when a signal at the first output is transitioning from a first voltage level to a second voltage level and a majority of the plurality of first nodes is transitioning from the second voltage level to the first voltage level.

31. The apparatus of claim 27, wherein the drive control further is operable to:
dynamically determine based upon the dynamic condition if a drive strength of a second output coupled to a second node is to be adjusted; and
dynamically adjusting the drive strength of the second output when determining indicates the drive strength of the second output is to be adjusted.

32. An apparatus comprising:
a first output coupled to a transmission line having a varying impedance based on a first plurality of values to be provided sequentially in time to a first output; and
a drive coupled to the first output and operable to:
monitor the first plurality of values; and
dynamically adjust a drive strength of the first output based on a determination that the drive strength of the first output is to be adjusted as a result of the first plurality of values.

33. The apparatus of claim 32, wherein:
the drive control is further operable to monitor a second plurality of values to be provided substantially simultaneously in time to a plurality of second nodes that are adjacent to the second output; and
the means for dynamically adjusting further is for dynamically adjusting the drive strength of the second output based on the second plurality of values.

* * * * *